(12) United States Patent
Li

(10) Patent No.: US 11,804,582 B2
(45) Date of Patent: Oct. 31, 2023

(54) LIGHT-EMITTING DIODE CHIP STRUCTURES WITH REFLECTIVE ELEMENTS

(71) Applicant: Jade Bird Display (Shanghai) Limited, Shanghai (CN)

(72) Inventor: Qiming Li, Albuquerque, NM (US)

(73) Assignee: Jade Bird Display (Shanghai) Limited, Shanghai (CN)

( * ) Notice: Subject to any disclaimer, the term of this patent is extended or adjusted under 35 U.S.C. 154(b) by 212 days.

(21) Appl. No.: 17/236,497

(22) Filed: Apr. 21, 2021

(65) Prior Publication Data

US 2021/0328116 A1    Oct. 21, 2021

Related U.S. Application Data

(60) Provisional application No. 63/013,358, filed on Apr. 21, 2020.

(51) Int. Cl.
*H01L 33/60* (2010.01)
*H01L 33/62* (2010.01)
*H01L 25/075* (2006.01)
*G09G 3/32* (2016.01)

(52) U.S. Cl.
CPC .............. *H01L 33/60* (2013.01); *G09G 3/32* (2013.01); *H01L 25/0753* (2013.01); *H01L 33/62* (2013.01)

(58) Field of Classification Search
CPC ......... G09G 3/32; H01L 27/156; H01L 33/60; H01L 25/0753; H01L 33/62
See application file for complete search history.

(56) References Cited

U.S. PATENT DOCUMENTS

| 2006/0197102 | A1  | 9/2006  | Ogihara |
| 2008/0083830 | A1* | 4/2008  | Tokunaga ............... H01L 27/13 257/E27.113 |
| 2008/0194054 | A1  | 8/2008  | Lin et al. |
| 2011/0284887 | A1  | 11/2011 | Wu et al. |
| 2011/0297914 | A1* | 12/2011 | Zheng ..................... H01L 33/46 257/13 |
| 2013/0194669 | A1* | 8/2013  | De Waele ......... H01L 31/02168 977/773 |

(Continued)

OTHER PUBLICATIONS

The International Searching Authority, The International Search Report and The Written Opinion, PCT/US2021/028364, Hong Kong Beida Jade Bird Display Limited, dated Aug. 5, 2021, 7 pages.

(Continued)

*Primary Examiner* — Feifei Yeung Lopez
(74) *Attorney, Agent, or Firm* — Morgan, Lewis & Bockius LLP

(57) ABSTRACT

A light-emitting diode (LED) chip structure with a cup-like reflective element is provided. The LED chip structure comprises a substrate, an isolation element and a mesa including an LED surrounded by the isolation element. The isolation element comprises an upper isolation part and a lower isolation part. The lower isolation part is positioned in the substrate and the upper isolation part protrudes from a surface of the substrate. A reflective layer is disposed on a sidewall of the upper isolation part, and a bottom of the reflective layer does not contact the mesa. The cup-like reflective element at least includes the isolation element with the reflective layer.

23 Claims, 4 Drawing Sheets

(56) References Cited

U.S. PATENT DOCUMENTS

| | | | |
|---|---|---|---|
| 2015/0115293 A1* | 4/2015 | Wu | H01L 24/24 |
| | | | 438/28 |
| 2015/0207038 A1* | 7/2015 | Hwang | H01L 33/405 |
| | | | 257/88 |
| 2015/0333221 A1* | 11/2015 | Bibl | H01L 21/6835 |
| | | | 438/34 |
| 2017/0133357 A1* | 5/2017 | Kuo | H01L 25/167 |
| 2017/0179097 A1* | 6/2017 | Zhang | H01L 25/167 |
| 2017/0256748 A1 | 9/2017 | Koike | |
| 2018/0090058 A1* | 3/2018 | Chen | G09G 3/32 |
| 2019/0074417 A1 | 3/2019 | Andrews et al. | |
| 2019/0198709 A1 | 6/2019 | Wildeson | |
| 2021/0091257 A1* | 3/2021 | Hwang | H01L 33/62 |
| 2021/0125972 A1 | 4/2021 | Jang | |
| 2021/0217739 A1* | 7/2021 | Lee | H01L 33/50 |

OTHER PUBLICATIONS

The International Searching Authority, The International Search Report and The Written Opinion, PCT/US2021/028371, Hong Kong Beida Jade Bird Display Limited, dated Jul. 27, 2021, 7 pages.

* cited by examiner

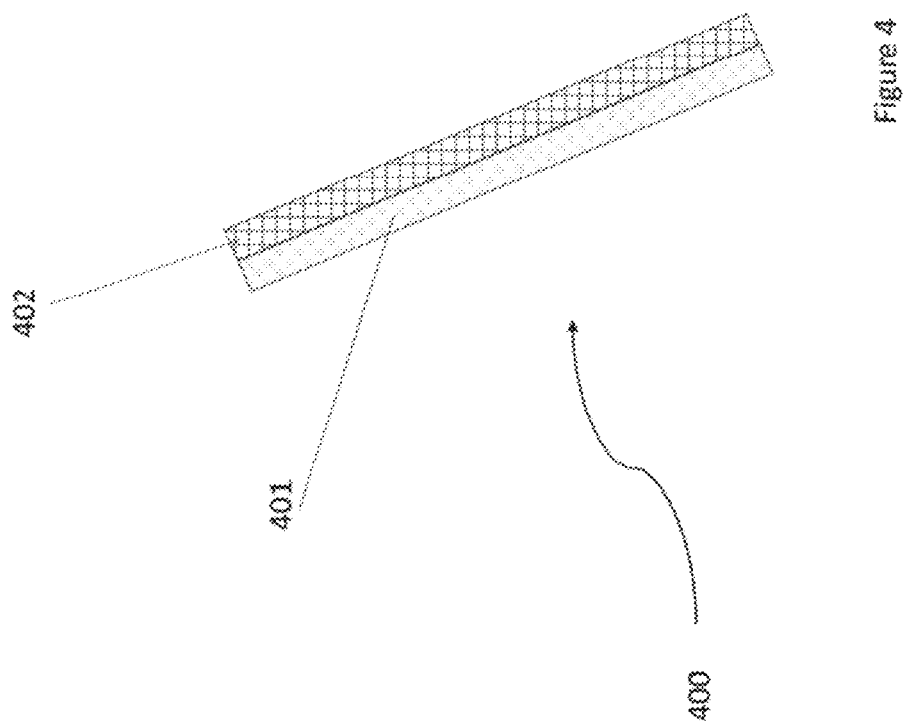

LIGHT-EMITTING DIODE CHIP STRUCTURES WITH REFLECTIVE ELEMENTS

RELATED APPLICATION

This application claims priority to U.S. Provisional Patent Application No. 63/013,358, filed Apr. 21, 2020, entitled "LIGHT-EMITTING DIODE CHIP STRUCTURES WITH REFLECTIVE ELEMENTS," which is hereby incorporated by reference.

TECHNICAL FIELD

The present disclosure relates generally to light-emitting diode (LED) display devices, and more particularly, to LED chip structures with one or more reflective elements.

BACKGROUND

With the development of mini LED and micro LED technologies in recent years, consumer devices and applications such as augmented reality (AR), projection, heads-up display (HUD), mobile device displays, wearable device displays, and automotive displays, require LED panels with improved resolution and brightness. LEDs can be miniaturized and act as pixel light emitters in a display system, for example in a micro-display system. When trying to achieve better resolution and brightness on a small display, it may be challenging to meet both the resolution and brightness requirements. That is, pixel resolution and brightness may be difficult to balance at the same time as they can have an opposite relationship. For example, getting a high brightness for each pixel may result in a low resolution. On the other hand, obtaining a high resolution may bring the brightness down.

Also, light emitted by the micro-LED may be generated from spontaneous emissions and thus may not be directional, resulting in a large divergence angle. A large divergence angle may cause various problems in a micro-LED display. On one hand, due to the large divergence angle, only a small portion of the light emitted by the micro-LEDs can be utilized. This may significantly reduce the efficiency and brightness of a micro-LED display system. On the other hand, due to the large divergence angle, the light emitted by one micro-LED pixel may illuminate its adjacent pixels, resulting in light crosstalk between pixels, loss of sharpness, and loss of contrast. Conventional solutions reducing the large divergence angle may not effectively handle the light emitted from the micro-LED as a whole, and may utilize only the central portion of the light emitted from the micro-LED, leaving the rest of the light emitted at more oblique angles to be unutilized.

As a result, it would be desirable to provide an LED structure for display devices that addresses the above-mentioned drawbacks, amongst others.

SUMMARY

Exemplary embodiments of the present disclosure are directed to LED chip structures with one or more reflective elements. In some embodiments, the reflective elements are cup-like structures that surround an LED pixel unit.

Exemplary embodiments of LED chip structures in the present disclosure include an isolation element comprising an upper isolation part and a lower isolation part. Exemplary embodiments also include a reflective layer disposed directly or indirectly on the upper isolation part. The isolation element can reduce the divergence of light emitted from a mesa including an LED pixel unit, and reduce the light crosstalk between adjacent pixels. For example, the isolation element and the reflective layer can utilize the light from oblique angles. In this way, higher efficiency can be achieved in collecting and converging this light for high-brightness and power-efficient display than conventional solutions. In addition, the isolation element can block the light emitting from LEDs in adjacent pixels, which can effectively suppress the inter-pixel crosstalk and enhance color contrast and sharpness. Exemplary embodiments of the present disclosures can improve projection brightness and contrast, and therefore reduce power consumption in projection applications. Exemplary embodiments of the present disclosures can also improve the light-emission directionality of the display, and therefore provide user with better image quality and protect user's privacy in direct-view applications.

Exemplary embodiments of the present disclosure can provide multiple advantages. One advantage is that exemplary embodiments of the present disclosure can suppress inter-pixel light crosstalk and enhance brightness. For example, pitch refers to the distance between the centers of adjacent pixels on a display panel. Pitch may vary from about 40 microns, to about 20 microns, to about 10 microns, and/or to about 5 microns or below. A single pixel area is fixed when the pitch specification is determined. Exemplary embodiments of the present disclosure can suppress the inter-pixel light crosstalk at a smaller pitch while enhancing brightness within a single pixel in a power-efficient manner. Another advantage is that in exemplary embodiments of the present disclosure, a light-emitting diode can be directly bonded on the substrate with pixel drivers without introducing an intermediate substrate, which can improve heat dissipation and thus enhance the reliability and performance of the LED chip.

The present disclosure thus includes, without limitation, the following exemplary embodiments.

Some exemplary embodiments provide a first LED chip structure. The first LED chip structure comprises a substrate and an isolation element. The isolation element comprises an upper isolation part and a lower isolation part. The lower isolation part is positioned in the substrate, and the upper isolation part protrudes from a surface of the substrate. The first LED chip structure also comprises a reflective layer disposed on a sidewall of the upper isolation part. The first LED chip structure further comprises a mesa including an LED component surrounded by the isolation element, and a bottom portion of the reflective layer does not contact the mesa.

In some exemplary embodiments or any combination of preceding exemplary embodiments of the first LED chip structure, the substrate includes a semiconductor wafer and a bonding metal layer on top of the semiconductor wafer.

In some exemplary embodiments or any combination of preceding exemplary embodiments of the first LED chip structure, the reflective layer is disposed on the sidewall and a top surface of the upper isolation part, and the bottom portion of the reflective layer extends in a direction from the isolation element to the mesa.

In some exemplary embodiments or any combination of preceding exemplary embodiments of the first LED chip structure, the first LED chip structure further comprises a dielectric layer which is disposed at a bottom of a sidewall of the mesa, and the dielectric layer is covered by the bottom portion of the reflective layer.

In some exemplary embodiments or any combination of preceding exemplary embodiments of the first LED chip structure, a height of the upper isolation part is higher than a height of the lower isolation part.

In some exemplary embodiments or any combination of preceding exemplary embodiments of the first LED chip structure, a bottom width of the upper isolation part is equal to or wider than a top width of the lower isolation part.

In some exemplary embodiments or any combination of preceding exemplary embodiments of the first LED chip structure, the bottom width of the upper isolation part is longer than the top width of the lower isolation part and shorter than twice the top width of the lower isolation part, two protrusions are formed at each bottom end of the upper isolation part, and a width of each of the two protrusions is less than half of the top width of the lower isolation part.

In some exemplary embodiments or any combination of preceding exemplary embodiments of the first LED chip structure, in a side view, a cross section of the upper isolation part is a trapezoid and a cross section of the lower isolation part is an inverted trapezoid, the bottom of the upper isolation part covering a top of the lower isolation part. In some embodiments, an area of the bottom of the upper isolation part is greater than an area of the top of the lower isolation part.

In some exemplary embodiments or any combination of preceding exemplary embodiments of the first LED chip structure, the upper isolation part and the lower isolation part are axisymmetric and co-axial.

In some exemplary embodiments or any combination of preceding exemplary embodiments of the first LED chip structure, a height of the upper isolation part is higher than a height of the mesa, relative to a surface of the substrate, and a tilt angle of the sidewall of the upper isolation part is greater than a tilt angle of the sidewall of the mesa, relative to an axis normal to the surface of the substrate.

In some exemplary embodiments or any combination of preceding exemplary embodiments of the first LED chip structure, the tilt angle of the sidewall of the mesa is smaller than 45°, and the tilt angle of the sidewall of the upper isolation part is greater than 45°.

In some exemplary embodiments or any combination of preceding exemplary embodiments of the first LED chip structure, the dielectric layer covers a top surface and the sidewall of the mesa, the top surface of the mesa including an area not covered by the dielectric layer or free of the dielectric layer.

In some exemplary embodiments or any combination of preceding exemplary embodiments of the first LED chip structure, the dielectric layer is transparent to the light emitted from the first LED chip structure.

In some exemplary embodiments or any combination of preceding exemplary embodiments of the first LED chip structure, the dielectric layer comprises one or more of silicon-containing dielectric layer, aluminum-containing dielectric layer or titanium-containing dielectric layer.

In some exemplary embodiments or any combination of preceding exemplary embodiments of the first LED chip structure, the silicon-containing dielectric layer comprises an oxide or nitride of silicon, the aluminum-containing dielectric layer comprises an oxide of aluminum, and the titanium-containing dielectric layer comprises an oxide of titanium.

In some exemplary embodiments or any combination of preceding exemplary embodiments of the first LED chip structure, the oxide of titanium is $Ti_3O_5$.

In some exemplary embodiments or any combination of preceding exemplary embodiments of the first LED chip structure, the reflective layer includes a multi-layered structure.

In some exemplary embodiments or any combination of preceding exemplary embodiments of the first LED chip structure, the multi-layered structure comprises a stack of one or more reflective material layers and one or more dielectric material layers.

In some exemplary embodiments or any combination of preceding exemplary embodiments of the first LED chip structure, the reflective layer comprises one or more metallic conductive materials with a high reflectance. In some embodiments, the high reflectance is above 70%. In some embodiments, the high reflectance is above 80%. In some embodiments, the high reflectance is above 90%.

In some exemplary embodiments or any combination of preceding exemplary embodiments of the first LED chip structure, the one or more metallic conductive materials comprise one or more of aluminum, gold or silver.

In some exemplary embodiments or any combination of preceding exemplary embodiments of the first LED chip structure, the top surface and the sidewall of the mesa and the top surface and the sidewall of the upper isolation part are fully or partially covered by a conductive layer. In some embodiments, the conductive layer is continuous.

In some exemplary embodiments or any combination of preceding exemplary embodiments of the first LED chip structure, the conductive layer is transparent to the light emitted from the first LED chip structure.

In some exemplary embodiments or any combination of preceding exemplary embodiments of the first LED chip structure, the isolation element comprises photosensitive dielectric material.

In some exemplary embodiments or any combination of preceding exemplary embodiments of the first LED chip structure, the photosensitive dielectric material is SU-8 or photosensitive polyimide (PSPI).

Other exemplary embodiments provide a second LED chip structure. The second LED chip structure comprises a substrate, an isolation element, a mesa, a dielectric layer and a conductive layer. The isolation element comprises an upper isolation part and a lower isolation part. The lower isolation part is positioned in the substrate and the upper isolation part protrudes from a surface of the substrate. The mesa including an LED component is surrounded by the isolation element. The dielectric layer covers a top surface and a sidewall of the mesa, and the top surface of the mesa further includes an area not covered by the dielectric layer, e.g. free of the dielectric layer. The conductive layer covers the dielectric layer, the top surface of the mesa with the area free of the dielectric layer, and at least a sidewall of the upper isolation part. The reflective layer is at least disposed on the conductive layer covering the sidewall of the upper isolation part, and a bottom portion of the reflective layer does not contact the mesa.

In some exemplary embodiments or any combination of preceding exemplary embodiments of the second LED chip structure, the substrate includes a semiconductor wafer and a bonding metal layer on top of the semiconductor wafer.

In some exemplary embodiments or any combination of preceding exemplary embodiments of the second LED chip structure, the conductive layer is disposed on a top surface and the sidewall of the upper isolation part, and the reflective layer is disposed on the conductive layer disposed on the top surface and the side wall of the upper isolation part, and wherein the bottom portion of the reflective layer extends from the isolation element to the mesa.

In some exemplary embodiments or any combination of preceding exemplary embodiments of the second LED chip structure, a height of the upper isolation part is higher than a height of the lower isolation part.

In some exemplary embodiments or any combination of preceding exemplary embodiments of the second LED chip structure, a bottom width of the upper isolation part is equal to or wider than a top width of the lower isolation part.

In some exemplary embodiments or any combination of preceding exemplary embodiments of the second LED chip structure, the bottom width of the upper isolation part is longer than the top width of the lower isolation part and shorter than twice the top width of the lower isolation part, two protrusions are formed at each bottom end of the upper isolation part, and a width of each of the two protrusions is less than half of the top width of the lower isolation part.

In some exemplary embodiments or any combination of preceding exemplary embodiments of the second LED chip structure, in a side view, a cross section of the upper isolation part is a trapezoid and a cross section of the lower isolation part is an inverted trapezoid, the bottom of the upper isolation part covering a top of the lower isolation part. In some embodiments, an area of the bottom of the upper isolation part is greater than an area of the top of the lower isolation part.

In some exemplary embodiments or any combination of preceding exemplary embodiments of the second LED chip structure, the upper isolation part and the lower isolation part are axisymmetric and co-axial.

In some exemplary embodiments or any combination of preceding exemplary embodiments of the second LED chip structure, a height of the upper isolation part is higher than a height of the mesa, relative to a surface of the substrate, and a tilt angle of the sidewall of the upper isolation part is greater than a tilt angle of the sidewall of the mesa, relative to an axis normal to the surface of the substrate.

In some exemplary embodiments or any combination of preceding exemplary embodiments of the second LED chip structure, the tilt angle of the sidewall of the mesa is smaller than 45°, and the tilt angle of the sidewall of the upper isolation part is greater than 45°.

In some exemplary embodiments or any combination of preceding exemplary embodiments of the second LED chip structure, the dielectric layer is transparent to the light emitted from the second LED chip structure.

In some exemplary embodiments or any combination of preceding exemplary embodiments of the second LED chip structure, the dielectric layer comprises one or more of silicon-containing dielectric layer, aluminum-containing dielectric layer or titanium-containing dielectric layer.

In some exemplary embodiments or any combination of preceding exemplary embodiments of the second LED chip structure, the silicon-containing dielectric layer comprises an oxide or nitride of silicon, the aluminum-containing dielectric layer comprises an oxide of aluminum, and the titanium-containing dielectric layer comprises an oxide of titanium.

In some exemplary embodiments or any combination of preceding exemplary embodiments of the second LED chip structure, the oxide of titanium is $Ti_3O_5$.

In some exemplary embodiments or any combination of preceding exemplary embodiments of the second LED chip structure, the reflective layer includes a multi-layered structure.

In some exemplary embodiments or any combination of preceding exemplary embodiments of the second LED chip structure, the multi-layered structure comprises a stack of one or more reflective material layers and one or more dielectric material layers.

In some exemplary embodiments or any combination of preceding exemplary embodiments of the second LED chip structure, the reflective layer comprises one or more metallic conductive materials with a high reflectance. In some embodiments, the high reflectance is above 70%. In some embodiments, the high reflectance is above 80%. In some embodiments, the high reflectance is above 90%.

In some exemplary embodiments or any combination of preceding exemplary embodiments of the second LED chip structure, the one or more metallic conductive materials comprise one or more of aluminum, gold or silver.

In some exemplary embodiments or any combination of preceding exemplary embodiments of the second LED chip structure, the conductive layer is transparent to the light emitted from the second LED chip structure.

In some exemplary embodiments or any combination of preceding exemplary embodiments of the second LED chip structure, the isolation element comprises photosensitive dielectric material.

In some exemplary embodiments or any combination of preceding exemplary embodiments of the second LED chip structure, the photosensitive dielectric material is SU-8 or photosensitive polyimide (PSPI).

These and other features, aspects, and advantages of the present disclosure will be apparent from a reading of the following detailed description together with the accompanying figures, which are briefly described below. The present disclosure includes any combination of two or more features or elements set forth in this disclosure, regardless of whether such features or elements are expressly combined or otherwise recited in a specific example embodiment described herein. This disclosure is intended to be read holistically such that any separable features or elements of the disclosure, in any of its aspects and exemplary embodiments, should be viewed as combinable unless the context of the disclosure clearly dictates otherwise.

It will therefore be appreciated that this brief Summary is provided merely for purposes of summarizing some exemplary embodiments so as to provide a basic understanding of some aspects of the disclosure. Accordingly, it will be appreciated that the above described exemplary embodiments are merely examples and should not be construed to narrow the scope or spirit of the disclosure in any way. Other example embodiments, aspects and advantages will become apparent from the following detailed description taken in conjunction with the accompanying figures which illustrate, by way of example, the principles of some described exemplary embodiments.

BRIEF DESCRIPTION OF THE DRAWINGS

So that the present disclosure can be understood in greater details, a more particular description may be had by reference to the features of various embodiments, some of which are illustrated in the appended drawings. The appended drawings, however, merely illustrate pertinent features of the present disclosure and are therefore not to be considered limiting, for the description may admit to other effective features.

FIG. 4 illustrates a cross-sectional view of a reflective layer with a multi-layered structure, in accordance with some exemplary embodiments.

Figure 1:
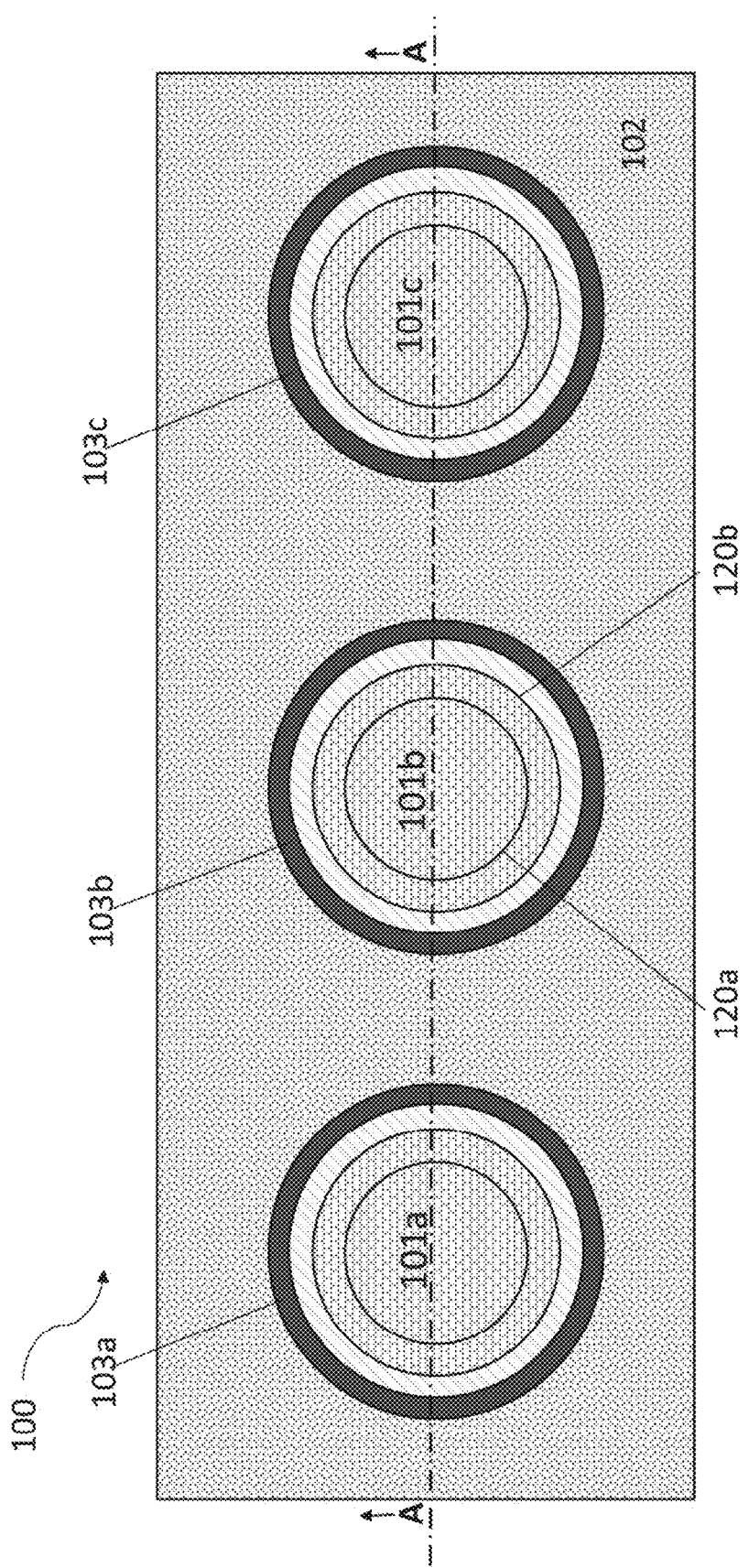
FIG. 1 illustrates a top view of an LED chip structure, in accordance with some exemplary embodiments.

In accordance with common practice, the various features illustrated in the drawings may not be drawn to scale. Accordingly, the dimensions of the various features may be arbitrarily expanded or reduced for clarity. In addition, some of the drawings may not depict all of the components of a given system, method or device. Finally, like reference numerals may be used to denote like features throughout the specification and figures.

DETAILED DESCRIPTION

Some embodiments of the present disclosure will now be described more fully hereinafter with reference to the accompanying figures, in which some, but not all embodiments of the disclosure are shown. Indeed, various embodiments of the disclosure may be embodied in many different forms and should not be construed as limited to the embodiments set forth herein; rather, these exemplary embodiments are provided so that this disclosure will be thorough and complete, and will fully convey the scope of the disclosure to those skilled in the art. For example, unless otherwise indicated, reference to something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Exemplary embodiments of the present disclosure are generally directed to LED display devices, and in particular, to LED chip structures with a reflective layer.

FIG. 1 illustrates a top view of an LED chip structure 100, in accordance with some exemplary embodiments. As shown, in some embodiments, the LED chip structure 100 includes one or more mesas 101 (e.g., mesas 101a, 101b and 101c). Each of the mesas 101 may include an LED or a micro-LED. Each of the mesas 101 has a top and a bottom. For example, the circle 120a may indicate a top of the mesa 101b and the circle 120b may indicate a bottom of the mesa 101b, and the surface connecting the top of the mesa 101b and the bottom of the mesa 101b. i.e., the sidewalls of the mesa, represented in the figure by the space between circle 120a and circle 120b. In some embodiments, the diameter of the top of each of the mesas 101 may be in the range of 1 μm-8 μm, and the diameter of the bottom of each of the mesas may be in the range of 3 μm-10 μm. In some embodiments, the diameter of the top of each of the mesas 101 may be in the range of 8 μm-25 μm, and the diameter of the bottom of each of the mesas may be in the range of 10 μm-35 μm. The distance between centers of the two adjacent mesas may be in the range of 1 μm-10 μm. In some embodiments, the distance between centers of the two adjacent mesas may vary from about 40 μm, to about 20 μm, to about 10 μm, and/or to about 5 μm or below. The sizes of the mesas and distances between the mesas depends on the resolution of the display. For example, for a display panel with 5000 Pixels Per Inch (PPI), the diameter or width of the top of the mesa 101b may be 1.5 μm and the diameter or width of the bottom of the mesa 101b may be 2.7 μm. The height of the mesa is about 1.3 μm. The distance between the closest bottom edges of the mesa 101a and the mesa 101b may be 2.3 μm.

In some embodiments, the mesas 101 may be surrounded by at least one isolation element 102. The isolation element 102 can isolate light emitted from different mesas. For example, the isolation element 102 can isolate at least some of the light emitted from the mesa 101a and/or 101c from the light emitted from the mesa 101b when a height of the isolation element 102 is higher than a height of the mesa 101a and/or 101c. Therefore, the isolation element 102 can suppress the inter-pixel light crosstalk and improve the contrast of LED displays.

In some embodiments, the LED chip structure 100 also includes one or more reflective layers 103 (e.g., reflective layers 103a, 103b and 103c). Each of the reflective layers 103 may be disposed on a sidewall of the isolation element 102. For example, as shown in FIG. 1, the reflective layer 103b may be disposed on a circular sidewall of the isolation element 102 surrounding the mesa 101b. The reflective layers 103 can reflect light emitted from the mesas 101 and therefore enhance the brightness and luminous efficacy of LED displays. For example, the light emitted from the mesa 101b may arrive at the reflective layer 103b and may be reflected upwardly by the reflective layer 103b.

The reflective layers 103, together with the isolation element 102, can utilize reflection direction and/or reflection intensity of the light emitted from the mesas 101. For instance, the sidewall of the isolation element 102 may be inclined at a certain angle, and therefore the reflective layer 103b disposed on the sidewall of the isolation element 102 is inclined at the same angle (within manufacturing tolerances). When the light emitted from the mesa 101b arrives at the reflective layer 103b, the light emitted from the mesa 101b would be reflected by the reflective layer 103b in accordance with the angle of the sidewall of the isolation element 102. The material of the reflective layers 103 may be highly reflective, and therefore most of (for example, above 60%) the light emitted from the mesas 101, e.g., the mesa 101b, can be reflected. Some elements of the LED chip structure 100 are omitted in FIG. 1 for simplicity of illustration. Some embodiments of LED chip structures with greater details will be described with reference to FIGS. 2-4 below.

Figure 2:
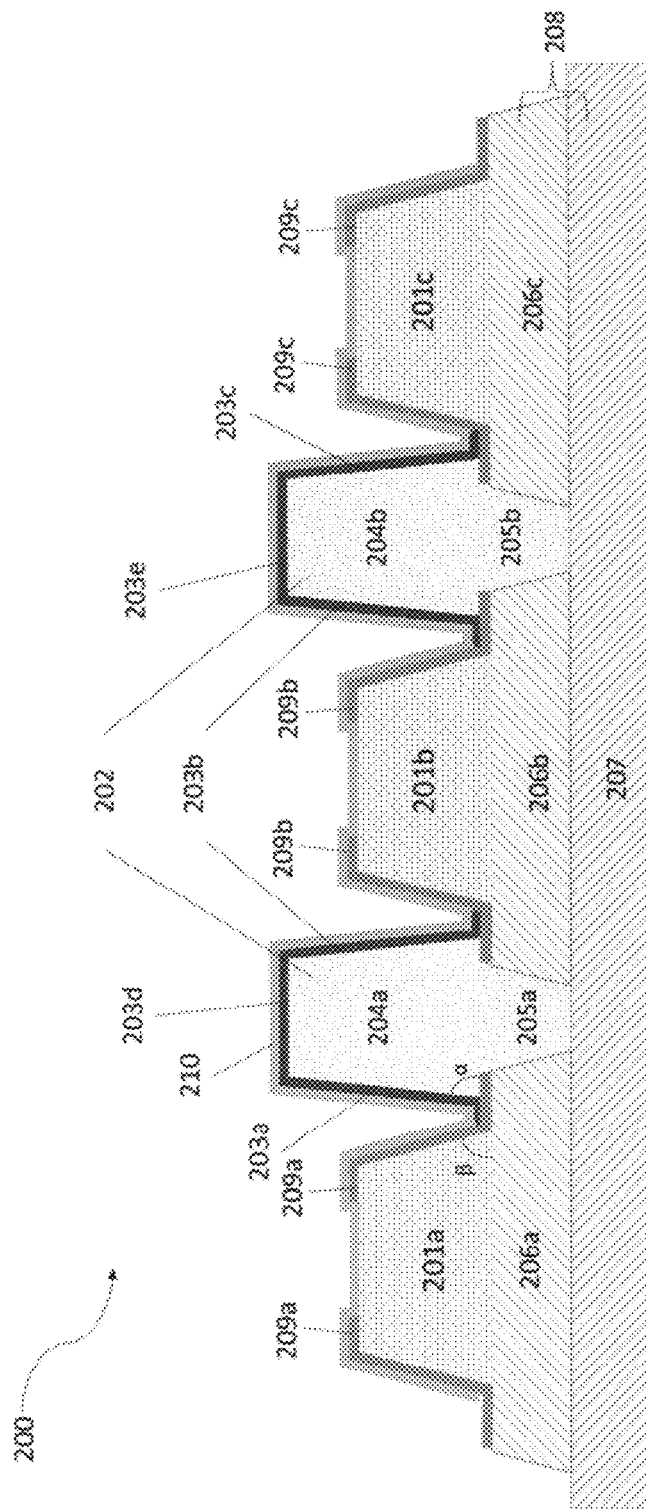
FIG. 2 illustrates a cross-sectional view of an LED chip structure, in accordance with some exemplary embodiments.

FIG. 2 illustrates a cross-sectional view of an LED chip structure 200, in accordance with some exemplary embodiments. In some embodiments, the cross section of the LED chip structure 200 is taken along the A-A line in FIG. 1. As shown, in some embodiments, the LED chip structure 200 includes a substrate 208, which includes a wafer 207 and one or more bonding metal layers 206 on top of the wafer 207. The bonding metal layer 206 (e.g., bonding metal layers 206a, 206b and 206c) may be disposed on the wafer 207 and electrically bond the wafer 207. In some embodiments, the thickness of the bonding metal layer 206 is about 0.1 micron to about 3 microns. For example, for a display panel with 5000 PPI, the thickness of a bonding metal layer 206 is about 1.3 μm. In some instances, two metal layers are included in the bonding metal layer 206. One of the metal layers is deposited on the mesa 201. A counterpart bonding metal layer is also deposited on the wafer 207. In some embodiments, compositions for the bonding metal layer 206 include Au—Au bonding, Au—Sn bonding, Au—In bonding, Ti—Ti bonding, Cu—Cu bonding, or a mixture thereof. For example, if Au—Au bonding is selected, the two layers of Au respectively need a Cr coating as an adhesive layer, and Pt coating as an anti-diffusion layer. And the Pt coating is between the Au layer and the Cr layer. The Cr and Pt layers are positioned on the top and bottom of the two bonded Au layers. In some embodiments, when the thicknesses of the two Au layers are about the same, under a high pressure and a high temperature, the mutual diffusion of Au on both layers bond the two layers together. Eutectic bonding, thermal compression bonding, and transient liquid phase (TLP) bonding are example techniques that may be used.

In some embodiments, the LED chip structure 200 may include a pixel driver integrated circuitry (IC) integrated in the wafer 207. The wafer 207 may contain silicon as a carrier material with high thermal conductivity, which can facilitate heat dissipation and provide low thermal expansion.

In some embodiments, the LED chip structure 200 also includes at least one isolation element 202, similar as the isolation element 102 explained above with reference to FIG. 1. As shown in FIG. 2, in some embodiments, the isolation element 202 may include one or more upper isolation parts 204 (e.g., upper isolation parts 204a and 204b) and one or more lower isolation parts 205 (e.g., lower isolation parts 205a and 205b). For example, as shown in FIG. 2, the isolation element 202 includes the upper isolation part 204a and the lower isolation part 205a. In some embodiments, the upper isolation part 204a and the lower isolation part 205a are integrally formed as one part as shown in FIG. 2. The lower isolation part 205a is positioned in the substrate 208, e.g., within the region of the bonding metal layer 206. The upper isolation part 204a protrudes from a surface of the substrate 208, e.g., from the top surface of the bonding metal layer 206, and is positioned on a top of the lower isolation part 205a.

In one embodiment, the upper isolation parts 204 (e.g., the upper isolation parts 204a and 204b) may be electrically connected to each other, e.g., by using a conductive material or expanding the upper isolation parts to contact or overlap with each other. In another embodiment, the upper isolation parts 204 (e.g., the upper isolation parts 204a and 204b) may be isolated from each other, e.g., by using a buffer space disposed between adjacent upper isolation parts.

In some embodiments, the LED chip structure 200 also includes one or more mesas 201 (e.g., mesas 201a, 201b and 201c) surrounded by the isolation element 202, similarly as explained above with reference to FIG. 1. For example, as shown in FIG. 2, the mesa 201b is surrounded by the isolation element 202, e.g., by the upper isolation parts 204a and 204b and by the lower isolation parts 205a and 205b. The mesas 201 may be positioned on top of the substrate 208, e.g., on top of the bonding metal layer 206, and may be driven by a pixel driver IC individually or collectively.

In some embodiments, the mesas 201 may be electrically connected to the wafer 207 via the bonding metal layer 206. For example, although not shown in FIG. 2, p-electrodes of mesas 201 and outputs of driving transistors may be positioned underneath the mesas 201, and are electrically connected by the bonding metal layer 206. The mesa current driving signal connection (between p-electrode of mesa and output of the pixel driver), ground connection (between n-electrode and system ground), the Vdd connection (between source of the pixel driver and system Vdd), and the control signal connection to the gate of the pixel driver are made in accordance with various embodiments, for example as described in U.S. patent application Ser. No. 15/135,217 (U.S. publication No. 2017/0179192) "Semiconductor Devices with Integrated Thin-Film Transistor Circuitry," which is incorporated by reference herein.

The mesas 201 may be LEDs or micro-LEDs, which produce widely diverging light. For example, the mesa 201b may be a LED or micro-LED, or may be a group of LEDs or micro-LEDs. In one embodiment, an amount of light emitted from the sidewalls of the mesas 201 is greater than the amount of light emitted from the top of the mesas 201. This may cause a wide divergence of the emitted light and a large angular extent of the far field profile, possibly up to 180 degrees, which creates inter-pixel light crosstalk. The isolation element 202 can suppress the inter-pixel light crosstalk. In some embodiments, as shown in FIG. 2, the mesa 201b is surrounded by the upper isolation parts 204a and 204b and by the lower isolation parts 205a and 205b. The isolation element 202 may perform as optical isolations isolating at least some of the light emitted from the mesas 201. For example, some of the light emitted from the mesa 201b may be isolated by the upper isolation parts 204a and 204b, thus preventing the light emitted from the mesas 201a and/or 201c from illuminating the light emitted from the mesa 201b.

In some embodiments, the LED chip structure 200 further includes one or more reflective layers 203 (e.g., reflective layers 203a, 203b and 203c), similarly as explained above with reference to FIG. 1. Each of the reflective layers 203 is disposed on one or more sidewalls of one or more upper isolation parts of the isolation element 202. For example, as shown in FIG. 2, the reflective layer 203b is disposed on the sidewall of the upper isolation part 204a, and is also disposed on the sidewall of the upper isolation part 204b. In some embodiments, each of the reflective layers 203 including the bottom of each of the reflective layers does not directly contact the each of the mesas 201. For example, a bottom of the reflective layer 203b does not contact or directly touch the mesa 201b, or other mesas 201a and 201c. The reflective layers 203 can perform as passive optics that reflect some of the light emitted from mesas 201. For example, light emitted from the mesa 201b may arrive at and be reflected upwardly by the reflective layers 203b, thus reducing the divergence of light emitted by the mesa 201b.

In some embodiments, the reflective layers 203 are disposed on one or more sidewalls of one or more upper isolation parts 204 and/or disposed on a top surface of one or more upper isolation parts 204. For example, as shown in FIG. 2, the reflective layer 203b may be disposed on the sidewalls of the upper isolation parts 204a and 204b, and reflective layers 203d and 203e may be disposed on tops of the upper isolation parts 204a and 204b respectively. The bottom of the reflective layers 203 extends from the isolation element 202 to a mesa. For example, a bottom of the reflective layer 203b extends from the upper isolation parts 204a and 204b to the mesa 201b. In one embodiment, the reflective layers 203a-203e may be the same reflective layer formed in using the same materials in the same process.

In some embodiments, the reflective layers 203 may comprise one or more metallic conductive materials with a high reflectance to the light emitted from the LED chip structure 200. In some embodiments, the high reflectance is above 70%. In some embodiments, the high reflectance is above 80%. In some embodiments, the high reflectance is above 90%. In these embodiments, the one or more metallic conductive materials may comprise one or more of aluminum, gold or silver. In some embodiments, the reflective layers 203 can be fabricated by one or more of electron beam deposition or sputtering process.

In some embodiments, the LED chip structure 200 further includes one or more dielectric layers 209 (e.g., dielectric layers 209a, 209b and 209c). Each of the dielectric layers 209 may be positioned above a top surface portion of the bonding metal layer 206 between the mesas 201 at the bottom of a sidewall of each of the mesas 201. For example, for a display panel with 5000 PPI, the width of the top surface portion of the bonding metal layer 206 is 0.55 μm at one bottom side end of the mesa 201. And a bottom portion of the dielectric layer 209 above the top surface portion of the bonding metal layer 206 is covered by the bottom portion of each of the reflective layers 203. For example, as shown in FIG. 2, the dielectric layer 209b is disposed above a top surface portion of the bonding metal layer 206b between the mesas 201 at the bottom of a sidewall of the mesa 201b. And a bottom portion of the dielectric layer 209b above the top surface portion of the bonding metal layer 206b is covered by the bottom portion of each of the reflective layers 203b. In some embodiments, the dielectric layers 209 can be fabricated by one or more of chemical vapor deposition (CVD), atomic layer deposition (ALD) or sputtering.

In some embodiments, each of the dielectric layers 209 may further cover a top surface and the sidewall of each of the mesas 201, while the top surface of each of the mesas 201 may include an area not covered by the corresponding dielectric layer, i.e., an area free of dielectric layer. For example, as shown in FIG. 2, the dielectric layer 209b covers the sidewall of the mesa 201b as well as the top surface of the mesa 201b. The top surface of the mesa 201b includes an area or opening not covered by the dielectric layer 209b. Using the dielectric layers 209 can ensure that the bottom of each of the reflective layers 203 does not directly contact the mesas 201.

In some embodiments, the dielectric layer 209 may be transparent. In some embodiments, the dielectric layer 209 is transparent to the light emitted from the LED chip structure 200. In some embodiments, the dielectric layer 209 may comprise one or more of silicon-containing dielectric layer, aluminum-containing dielectric layer or titanium-containing dielectric layer. In these embodiments, for the dielectric layers 209, the silicon-containing dielectric layer may comprise an oxide or nitride of silicon, the aluminum-containing dielectric layer may comprise an oxide of aluminum, and the titanium-containing dielectric layer may comprise an oxide of titanium. In one embodiment, for the dielectric layer 209, the oxide of titanium is $Ti_3O_5$.

In some embodiments, the LED chip structure 200 further includes at least one conductive layer 210. The top surface and the sidewall of each of the mesas 201 and the top surface and the sidewall of each of the upper isolation parts 204 are covered by the conductive layer 210. For example, as shown in FIG. 2, the conductive layer 210, directly or indirectly, covers the top surfaces and the sidewalls of the upper isolation parts 204a and 205a as well as the top surface and the sidewall of the mesa 201b. In some embodiments, the conductive layer 210 is transparent. In some embodiments, the conductive layer 210 is transparent to the light emitted from the LED chip structure 200. In some embodiments, the conductive layer 210 may include a transparent conductive oxide (TCO) layer containing one or more of indium tin oxide (ITO) or ZnO.

Figure 3:
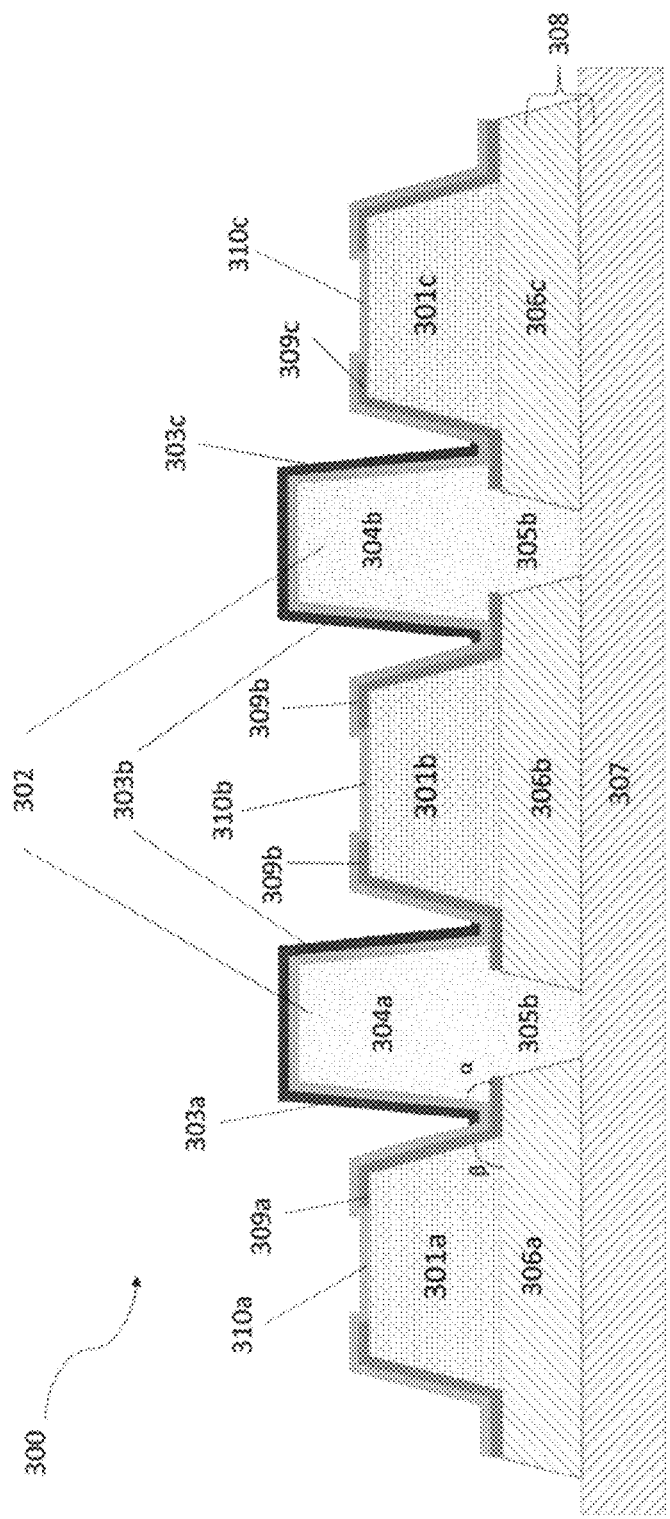
FIG. 3 illustrates a cross-sectional view of another LED chip structure, in accordance with some exemplary embodiments.

In some embodiments, the conductive layer 210 can be fabricated by one or more of thermal vaporization or sputtering process. The conductive layer 210 may be fabricated before or after the formation of the reflective layer 203, as long as current in the conductive layer 210, for example, current for an N-electrode, can be rapidly and uniformly distributed by the reflective layer 203. For example, the conductive layer 210 can be above the reflective layer 203 (as shown in FIG. 2) or covered by reflective layer 203 (as shown in FIG. 3). In some embodiments, the dielectric layers 209 may be fabricated before or after the formation of the isolation element 202, as long as the isolation element 202 and the conductive layer 210 are insulated from the bonding metal layer 206, for example, current for an N-electrode within the conductive layer 210 and the reflective layer 203 is insulated from the bonding metal layer 206 which is connected to a P-electrode. The conductive layer 210 can conduct electric current, e.g., between the mesa 201b and system Vdd.

As explained above, the isolation element 202 can isolate light emitted from one mesa (e.g., the mesa 201a) from light emitted from another mesa (e.g., the mesa 201b) when the isolation element 202 is higher than the mesas 201. In some embodiments, for the isolation element 202, the height of each of the upper isolation parts 204 is determined as the distance from the top surface of the upper isolation part 204 to the top surface of the bonding metal layer 206. In some embodiments, for the isolation element 202, the height of each of the lower isolation parts 205 is determined as the distance from the bottom surface of the lower isolation part 205 to the top surface of the bonding metal layer 206. In some embodiments, for the isolation element 202, heights of the upper isolation parts 204 may be higher than the heights of the lower isolation parts 205. For example, as shown in FIG. 2, a height of the upper isolation part 204a is higher than a height of the lower isolation part 205a. In other embodiments, the heights of the upper isolation parts 204 can be the same as or lower than the heights of the lower isolation part 205. In addition, heights of the upper isolation parts may be different. For example, the height of the upper isolation part 204a may be different from the height of the upper isolation part 204b. Heights of the lower isolation parts 205 may be different as well. For example, the height of the lower isolation part 205a may be different from the height of the lower isolation part 205b.

In some embodiments, for the isolation element 202, a bottom width of each of the upper isolation parts 204 may be equal to or wider than a top width of each of the lower isolation parts 205. For example, as shown in FIG. 2, a bottom width of the upper isolation part 204a may be equal to or wider than a top width of the lower isolation part 205b. For example, for a display panel with 5000 PPI, the bottom width of the upper isolation part 204b is about 1.7 μm, the top width of the lower isolation part 205b is about 1.2 μm and the bottom width of the lower isolation part 205b is about 0.3 μm. In these embodiments, there is a difference between the bottom width of the upper isolation part 204a and the top width of the lower isolation part 205a, and therefore two protrusions are formed at a bottom of the upper isolation part 204a. The bottom width of the upper isolation part 204a may exceed the top width of the lower isolation part 205a by less than the top width of the lower isolation part 205a. The total bottom width of the upper isolation part 204a is longer than the top width of the lower isolation part 204a but is shorter than twice the top width of the lower isolation part 204a. In some embodiments, the width of each of the protrusions is less than half of the top width of the lower isolation part 204a. In other embodiments, widths of each of the two protrusions may be different. For example, a width of the left protrusion of the bottom of the upper isolation part 204a is different from the width of the right protrusion of the bottom of the upper isolation part 204a. For example, for a display panel with 5000 PPI, a width of the left protrusion of the bottom of the upper isolation part 204a is about 0.2 μm.

In some embodiments, for the isolation element 202, a cross section of each of the upper isolation parts 204 is a trapezoid and a cross section of each of the lower isolation parts 205 is an inverted trapezoid, and the bottom of each of the upper isolation parts 204 covers a top of each of the lower isolation parts 205. In some embodiments, an area of the bottom of the upper isolation part 204 is greater than an area of the top of the lower isolation part 205. For example, as shown in FIG. 2, a cross section of the upper isolation part 204a is a trapezoid and a cross section of the lower isolation part 205a is an inverted trapezoid. The bottom of the upper isolation part 204a covers a top of the lower isolation part 205a. In addition, the trapezoid and the inverted trapezoid may be isosceles or right-angled. For example, the upper isolation part 204a is trapezoid and the lower isolation part 205a is inverted trapezoid, both of which can be isosceles. In other embodiments, an upper isolation part (e.g., the upper isolation part 204a) and a corresponding lower isolation part (e.g., the lower isolation part 205a) may be axisymmetric and/or co-axial.

In some embodiments, a height of each the upper isolation parts 204 may be higher than a height of each of the mesas 201, relative to a surface of the bonding metal layer 206. In some embodiments, a tilt angle of the sidewall of each of the upper isolation parts 204 may be greater than a tilt angle of the sidewall of each of the mesas 201, relative to an axis normal to the surface of the wafer 207.

For example, as shown in FIG. 2, the height of the upper isolation part 204a may be higher than a height of the mesa 201b, relative to a surface of the bonding metal layer 206. The height of the upper isolation part 204a may also be higher than rest of the mesas 201 (i.e., the mesa 201a and 201c). Also, as shown in FIG. 2, the tilt angle α relative to a top surface of the bonding metal layer 206 of the sidewall of an upper isolation part 204a may be smaller than 90°, and the tilt angle β relative to a top surface of the bonding metal layer 206 of the sidewall of the mesa 201a may be smaller than 90°. The tilt angle α of the sidewall of the upper isolation part 204a may be smaller than the tilt angle β of the sidewall of the mesa 201a. In some embodiments, the tilt angle β of the sidewall of the mesa 201a may be greater than 45°, and the tilt angle α of the sidewall of the upper isolation part 204a may be smaller than 45°.

In some embodiments, the isolation element 202 comprises dielectric material such as silicon oxide. In some embodiments, the isolation element 202 comprises photosensitive dielectric material. In some embodiments, the photosensitive dielectric material comprises SU-8 or photosensitive polyimide (PSPI). In other embodiments, the isolation element 202 comprises photoresist. Yet in some embodiments, the isolation element 202 can be produced by photo-lithography process.

The LED chip structure 200 can increase an overall collimation of light produced by the mesas 201. Light beams that are already fairly collimated (such as light beam emitted from tops of mesas) do not hit the isolation element 202 and emerge from the LED chip structure 200 without being redirected by the isolation element 202. In contrast, light beams that are not well collimated (such as light beams emitted from sidewalls of the mesas 201) will hit the isolation element 202 and be re-directed to a more collimated direction, including the same direction as the light beams emitted from the top of the mesas 201. Therefore, the divergence angles are reduced while the overall collimation of the light produced by the mesas 201, including in the forward direction (vertical direction of the LED chip surface), is increased. Luminous efficacy in a small angle and brightness of the LED chip structure 200 are also enhanced.

FIG. 3 illustrates a cross-sectional view of an LED chip structure 300, in accordance with some exemplary embodiments. In some embodiments, the cross section of the LED chip structure 300 is taken along the A-A line in FIG. 1. As shown, in some embodiments, the LED chip structure 300 includes a substrate 308, which includes a wafer 307 and one or more bonding metal layers 306 and on top of the wafer 307. Each bonding metal (e.g., bonding metal layer 306a, 306b and 306c) may be formed on the wafer 307. The materials and structures of the bonding metal layer 306 is similar to the bonding metal layer 206 described in FIG. 2. In some embodiments, the LED chip structure 300 may include a pixel driver IC integrated in the wafer 307. The wafer 307 may contain silicon as a carrier material with high thermal conductivity, which facilitates heat dissipation and realize low thermal expansion.

In some embodiments, the LED chip structure 300 also includes at least one isolation element 302, similar as the isolation element 102 explained above with reference to FIG. 1. As shown in FIG. 3, in some embodiments, the isolation element 302 may include one or more upper isolation parts 304 (e.g., upper isolation parts 304a and 304b) and one or more lower isolation parts 305 (e.g., lower isolation parts 305a and 305b). For example, as shown in FIG. 3, the isolation element 302 includes the upper isolation part 304a and the lower isolation part 305a. In some embodiments, the upper isolation part 304a and the lower isolation part 305a are integrally formed as one part as shown in FIG. 3. The lower isolation part 305a is positioned in the substrate 308, e.g., within the region of the bonding metal layer 306. The upper isolation part 304a protrudes from a surface of the substrate 308, e.g., from the top surface of the bonding metal layer 306, and is positioned on a top of the lower isolation part 305a.

In some embodiments, the isolation element 302 may comprise photosensitive dielectric material. In other embodiments, the photosensitive dielectric material may be SU-8 or photosensitive polyimide (PSPI). Yet in some embodiments, the isolation element 302 can be produced by photo-lithography process. In one embodiment, the upper isolation parts 304 (e.g., upper isolation parts 304a and 304b) may be electrically connected to each other, e.g., by using a conductive material or expanding the upper isolation parts to contact or overlap with each other. In another embodiment, the upper isolation parts 304 (e.g., upper isolation parts 304a and 304b) may be isolated from each other, e.g., by using a buffer space disposed between adjacent upper isolation parts.

In some embodiments, the LED chip structure 300 also includes one or more mesas 301 (e.g., mesas 301a, 301b and 301c) surrounded by the isolation element 302, similarly as explained above with reference to FIG. 1. For example, as shown in FIG. 3, the mesa 301b is surrounded by the isolation element 302, e.g., by the upper isolation parts 304a and 304b and by the lower isolation parts 305a and 305b. The mesas 301 may be positioned on top of the substrate 308, e.g., on top of the bonding metal layer 306, and may be driven by the pixel driver IC individually or collectively.

In some embodiments, the mesas 301 may be electrically connected to the wafer 307 via the bonding metal layer 306. For example, although not shown in FIG. 3, p-electrodes of mesas 301 and outputs of driving transistors may be positioned underneath the mesas 301, and are electrically connected by the bonding metal layer 306. The mesas 301 may be LEDs or micro-LEDs, which produce widely diverging light. For example, the mesa 301b may be a LED or micro-LED, or may be a group of LEDs or micro-LEDs. The isolation element 302 can suppress the inter-pixel crosstalk. In some embodiments, as shown in FIG. 3, the mesa 301b is surrounded by the upper isolation parts 304a and 304b and by the lower isolation parts 305a and 305b. The isolation element 302 may perform as optical isolations isolating some of the light emitted from the mesas 301. For example, some of the light emitted from the mesa 301b may be isolated by the upper isolation parts 304a and 304b, thus suppressing the inter-pixel light crosstalk.

In some embodiments, the LED chip structure 300 further includes one or more dielectric layers 309 (e.g., dielectric layers 309a, 309b and 309c). Each of the dielectric layers 309 may be positioned above a top surface portion of the bonding metal layer 306 between the mesas 301 at the bottom of a sidewall of each of the mesas 301. For example, for a display panel with 5000 PPI, the width of the top surface portion of the bonding metal layer 306 is 0.55 μm at one bottom side end of the mesa 301. And a bottom portion of the dielectric layer 309 above the top surface portion of the bonding metal layer 306 is covered by a bottom portion of each of the conductive layers 310 as described below.

In some embodiments, each of the dielectric layers 309 may cover a top surface and a sidewall of each of the mesas 301, while the top surface of each of the mesas 301 may include an area not covered by the corresponding dielectric layer. For example, as shown in FIG. 3, the dielectric layer 309b covers the sidewall of the mesa 301b, as well as part of the top surface of the mesa 301b. In addition, the top surface of the mesa 301b includes an area or opening not covered by the dielectric layer 309b. Using the dielectric layers 309 can ensure that a conductive layer 310 or the bottom of each of the reflective layers 303 does not directly contact the mesas 301. In some embodiments, the dielectric layers 309 can be produced by one or more of CVD, ALD or sputtering process.

In some embodiments, the dielectric layers 309 may be transparent. In some embodiments, the dielectric layers 309 are transparent to the light emitted from the LED chip structure 300. In some embodiments, the dielectric layers 309 may comprise one or more of silicon-containing dielectric layer, aluminum-containing dielectric layer or titanium-containing dielectric layer. In these embodiments, for the dielectric layers 309, the silicon-containing dielectric layer may comprise an oxide or nitride of silicon, the aluminum-containing dielectric layer may comprise an oxide of aluminum, and the titanium-containing dielectric layer may comprise an oxide of titanium. In other embodiments, the oxide of titanium may be $Ti_3O_5$.

In some embodiments, the LED chip structure 300 further includes at least one conductive layer 310. As shown in FIG. 3, the conductive layer 310 covers the dielectric layers 309, the top surface of each of the mesas 301 with the area not covered by the dielectric layers 309, and a sidewall of each of the upper isolation parts 304 (e.g., the upper isolation parts 304a and 304b). In some embodiments, as shown in FIG. 3, the conductive layer 310 covers the top surfaces and the sidewalls of the upper isolation parts 304a and 304b as well as the top surface and the sidewall of the mesas such as the mesa 301b. In some embodiments, the conductive layer 310 is transparent. In some embodiments, the conductive layer 310 is transparent to the light emitted from the LED chip structure 300. In some embodiments, the conductive layer 310 may include a transparent conductive oxide (TCO) layer containing one or more of indium tin oxide (ITO) or ZnO.

In some embodiments, the conductive layer 310 can be fabricated by one or more of thermal vaporization or sputtering process. The conductive layer 310 may be fabricated before or after the formation of the reflective layer 303, as long as current in the conductive layer 310, for example, current for an N-electrode, can be rapidly and uniformly distributed by the reflective layer 303. For example, the conductive layer 310 can be above the reflective layer 303 (as shown in FIG. 2) or covered by reflective layer 303 (as shown in FIG. 3). In some embodiments, the dielectric layers 309 may be fabricated before or after the formation of the isolation element 302, as long as the isolation element 302 and the conductive layer 310 are insulated from the bonding metal layer 206, for example, current for an N-electrode within the conductive layer 310 and the reflective layer 303 is insulated from the bonding metal layer 306 which is connected to a P-electrode. The conductive layer 310 can conduct electric current, e.g., between the mesa 301b and system Vdd.

In some embodiments, the LED chip structure 300 further includes one or more reflective layers 303 (e.g., reflective layers 303a, 303b and 303c), similarly as explained above with reference to FIG. 1. Each of the reflective layers 303 is disposed on at least one or more sidewalls of one or more upper isolation parts 304 of the isolation element 302, and a bottom of each of the reflective layers 303 may not contact the mesas 301. For example, as shown in FIG. 3, the reflective layer 303b is disposed on the sidewall of the upper isolation part 304a, as well as the sidewall of the upper isolation part 304b. In some embodiments, each of the reflective layers 303 including the bottom of each of the reflective layers 303 does not directly contact the each of the mesas 301. A bottom of the reflective layer 303b may not contact or directly touch the mesa 301b. The reflective layers 303 can perform as passive optics that reflect some of the light emitted from mesas 301. For example, light emitted from the mesa 301b may arrive at and be reflected upwardly by the reflective layer 303b, thus reducing the divergence of light emitted by the mesa 301b and enhancing the brightness and luminous efficacy.

In some embodiments, the reflective layers 303 may comprise one or more metallic conductive materials with a high reflectance to the light emitted from the LED chip structure 300. In some embodiments, the high reflectance is above 70%. In some embodiments, the high reflectance is above 80%. In some embodiments, the high reflectance is above 90%. In these embodiments, the one or more metallic conductive materials may comprise one or more of aluminum, gold or silver. In some embodiments, the reflective layers 303 can be fabricated by one or more of electron beam deposition or sputtering process.

In some embodiments, the conductive layer 310 may be disposed on a top surface and the sidewall of each of the upper isolation parts 304 (e.g., the upper isolation parts 304a and 304b), and the reflective layer may be disposed on the conductive layer disposed on the top surface and the side wall of each of the upper isolation part. For example, as shown in FIG. 3, the top surface and the sidewall of the upper isolation parts 304a and 304b are covered by the conductive layer 310, and the reflective layer further covers the conductive layer 310 covering the top surface and the sidewall of the upper isolation parts 304a and 304b. In some embodiments, the bottom of each of the reflective layers 303 may extend from the isolation element 302 to a corresponding mesa. For example, as shown in FIG. 3, the bottom of the reflective layer 303b extends from the upper isolation parts 304a and 304b of the isolation element 302 to the mesa 301b.

As explained above, the isolation element 302 can isolate light emitted from the mesas 301a and/or 301c from light emitted from the mesa 301b because of the height. In some embodiments, for the isolation element 302, the height of each of the upper isolation parts 304 is determined as the distance from the top surface of the upper isolation part 304 to the top surface of the bonding metal layer 306. In some embodiments, for the isolation element 302, the height of each of the lower isolation parts 305 is determined as the distance from the bottom surface of the lower isolation part 305 to the top surface of the bonding metal layer 306. In some embodiments, for the isolation element 302, heights of the upper isolation parts 304 may be higher than the heights of the lower isolation parts 305. For example, as shown in FIG. 3, a height of the upper isolation part 304a is higher than a height of the lower isolation part 305a. In other embodiments, the heights of the upper isolation parts 304 can be the same as or lower than the heights of the lower isolation part 305. In addition, the heights of the upper isolation parts may be different. For example, the height of the upper isolation part 304a may be different from the height of the upper isolation part 304b. The heights of the lower isolation parts 305 may be different from each other as well. For example, the height of the lower isolation part 305a may be different from the height of the lower isolation part 305b.

In some embodiments, for the isolation element 302, a bottom width of each of the upper isolation parts 304 may be equal to or wider than a top width of each of the lower isolation parts 305. For example, as shown in FIG. 3, a bottom width of the upper isolation part 304a may be equal to or wider than a top width of the lower isolation part 305b. For example, for a display panel with 5000 PPI, the bottom width of the upper isolation part 304b is about 1.7 µm, the top width of the lower isolation part 305b is about 1.2 µm and the bottom width of the lower isolation part 305b is about 0.3 µm. In these embodiments, there is a difference between the bottom width of the upper isolation part 304a and the top width of the lower isolation part 305a, and therefore two protrusions are formed at a bottom of the upper isolation part 304a. The bottom width of the upper isolation part 304a may exceed the top width of the lower isolation part 305a by less than the top width of the lower isolation part 305a. The total bottom width of the upper isolation part 304a is longer than the top width of the lower isolation part 304a but is shorter than twice the top width of the lower isolation part 304a. In some embodiments, the width of each of the protrusions is less than half of the top width of the lower isolation part 304a. In other embodiments, widths of each of the two protrusions may be different. For example, a width of the left protrusion of the bottom of the upper isolation part 304a is different from the width of the right protrusion of the bottom of the upper isolation part 304a. For example, for a display panel with 5000 PPI, a width of the left protrusion of the bottom of the upper isolation part 304a is about 0.2 µm.

In some embodiments, for the isolation element 302, a cross section of each of the upper isolation parts 304 is a trapezoid and a cross section of each of the lower isolation parts 305 is an inverted trapezoid, and the bottom of each of the upper isolation parts 304 covers a top of each of the lower isolation parts 305. In some embodiments, an area of the bottom of the upper isolation part 304 is greater than an area of the top of the lower isolation part 305. For example, as shown in FIG. 3, a cross section of the upper isolation part 304a is a trapezoid and a cross section of the lower isolation part 305a is an inverted trapezoid. The bottom of the upper isolation part 304a covers a top of the lower isolation part 305a. In addition, the trapezoid and the inverted trapezoid may be isosceles or right-angled. For example, the upper isolation part 304a is trapezoid and the lower isolation part 305a is inverted trapezoid, both of which can be isosceles. In other embodiments, an upper isolation part (e.g., the upper isolation part 304a) and a corresponding lower isolation part (e.g., the lower isolation part 305a) may be axisymmetric and/or co-axial.

In some embodiments, a height of each the upper isolation parts 304 may be higher than a height of each of the mesas 301 (e.g., mesa 301a, 301b and 301c), relative to a surface of the bonding metal layer 306, and a tilt angle of the sidewall of each of the upper isolation parts 304 may be greater than a tilt angle of the sidewall of each of the mesas 301 (e.g., mesa 301a, 301b and 301c), relative to an axis normal to the surface of the wafer 307.

For example, as shown in FIG. 3, the height of the upper isolation part 304a may be higher than a height of the mesa 301b, relative to a surface of the bonding metal layer 306. The height of the upper isolation part 304a may also be higher than rest of the mesas 301 (i.e., the mesa 301a and 301c). Also, as shown in FIG. 3, the tilt angle α relative to a top surface of the bonding metal layer 306 of the sidewall of an upper isolation part 304a may be smaller than 90°, and the tilt angle β relative to a top surface of the metal bonding layer 306 of the sidewall of the mesa 301a may be smaller than 90°. The tilt angle α of the sidewall of the upper isolation part 304a may be smaller than the tilt angle β of the sidewall of the mesa 301a. In some embodiments, the tilt angle β of the sidewall of the mesa 301a may be greater than 45°, and the tilt angle α of the sidewall of the upper isolation part 304a may be smaller than 45°.

FIGS. 1, 2 and 3 only illustrate the LED chip structures according to some embodiments. In other embodiments, the LED chip structures may include a different number of mesas 101 and/or a different number of reflective layers 103. In other embodiments, each of the mesas 101 may include multiple individual light elements, for example multiple LEDs or micro-LEDs connected in parallel or stacked one by one. In other embodiments, the mesas 101 may not be a circular shape from the top view. In other embodiments, the sidewall of the isolation element 102 surrounding each of the mesas 101 may not be a circular shape from the top view. That is, the sidewall of the isolation element 102 surrounding each of the mesas 101 may have other shapes from the top view, including but not limited to triangle, square, rectangular, pentagonal, hexagonal and octagonal. In other embodiments, the isolation element 102 may include multiple separate or isolated sub-elements and each sub-element may surround one mesa. Buffer spaces may be provided between the multiple separate or isolated sub-elements.

FIG. 4 illustrates a cross-sectional view of a reflective layer 400 with a multi-layered structure, in accordance with some exemplary embodiments. For the LED chip structures as described above, the reflective layer 400 may include a multi-layered structure. The multi-layered structure may comprise a stack of one or more reflective material layers and one or more dielectric material layers. In one exemplary embodiment, as illustrated in FIG. 4, the reflective layer 400 includes a multi-layered structure comprising one reflective material layer 401 and one dielectric material layer 402. In other embodiments, the multi-layered structure may comprise two reflective material layers and one dielectric material layer positioned between the two reflective material layers. Yet in some other embodiments, the multi-layered structure may also comprise two dielectric material layers and one reflective material layer positioned between the two dielectric material layers. In some embodiments, the multi-layered structure may comprise two or more metal layers. For example, the metal layers may comprise one or more of TiAu, CrAl or TiWAg.

In some embodiments, the multi-layered structure may be multi-layered Omni-Directional Reflector (ODR), which comprises a metal layer and Transparent and Conductive Oxides (TCO). For example, the multilayered structure may comprise a dielectric material layer, a metal layer and TCO layer. In some embodiments, the multi-layered structure may comprise two or more dielectric material layers, which are disposed alternately to form a Distributed Bragg Reflector (DBR). For example, the multi-layered structure may comprises a dielectric material layer, a metal layer and a transparent dielectric layer. The transparent dielectric layer may comprise one or more of $SiO_2$, $Si_3N_4$ or $Al_2O_3$. The multi-layered structure may further comprise a dielectric material layer, a TCO and a DBR. In other embodiments, the reflective layer 400 may comprise one or more metallic conductive materials with a high reflectance. In some embodiments, the high reflectance is above 70%. In some embodiments, the high reflectance is above 80%. In some embodiments, the high reflectance is above 90%. In these embodiments, the one or more metallic conductive materials may comprise one or more of aluminum, gold or silver.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

Different types of display panels can be fabricated according to one or more of embodiments in the present disclosure. For example, the resolution of a display panel can range from 8×8 to 3840×2160. Common display resolutions include QVGA with 320×240 resolution and an aspect ratio of 4:3, XGA with 1024×768 resolution and an aspect ratio of 4:3, D with 1280×720 resolution and an aspect ratio of 16:9, FHD with 1920×1080 resolution and an aspect ratio of 16:9, UHD with 3840×2160 resolution and an aspect ratio of 16:9, and 4K with 4096×2160 resolution. There can also be a wide variety of pixel sizes, ranging from sub-micron and below to 10 mm and above. The size of the overall display region can also vary widely, ranging from diagonals as small as tens of microns or less up to hundreds of inches or more.

Exemplary applications include display screens, light engines for home/office projectors and portable electronics such as smart phones, laptops, wearable electronics, AR and VR glasses, and retinal projections. The power consumption can vary from as low as a few milliwatts for retinal projectors to as high as kilowatts for large screen outdoor displays, projectors, and smart automobile headlights. In terms of frame rate, due to the fast response (nanoseconds) of inorganic LEDs, the frame rate can be as high as KHz, or even MHz for small resolutions.

Features of the present invention can be implemented in, using, or with the assistance of a computer program product, such as a storage medium (media) or computer readable storage medium (media) having instructions stored thereon/in which can be used to program a processing system to perform any of the features presented herein. The storage medium can include, but is not limited to, high-speed random access memory, such as DRAM, SRAM, DDR RAM or other random access solid state memory devices, and may include non-volatile memory, such as one or more magnetic disk storage devices, optical disk storage devices, flash memory devices, or other non-volatile solid state storage devices. Memory optionally includes one or more storage devices remotely located from the CPU(s). Memory or alternatively the non-volatile memory device(s) within the memory, comprises a non-transitory computer readable storage medium.

Stored on any machine readable medium (media), features of the present invention can be incorporated in software and/or firmware for controlling the hardware of a processing system, and for enabling a processing system to interact with other mechanisms utilizing the results of the present invention. Such software or firmware may include, but is not limited to, application code, device drivers, operating systems, and execution environments/containers.

It will be understood that, although the terms "first," "second," etc. may be used herein to describe various elements, these elements should not be limited by these terms. These terms are only used to distinguish one element from another.

The terminology used herein is for the purpose of describing particular embodiments only and is not intended to be limiting of the claims. As used in the description of the embodiments and the appended claims, the singular forms "a," "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined [that a stated condition precedent is true]" or "if [a stated condition precedent is true]" or "when [a stated condition precedent is true]" may be construed to mean "upon determining" or "in response to determining" or "in accordance with a determination" or "upon detecting" or "in response to detecting" that the stated condition precedent is true, depending on the context.

The foregoing description, for purpose of explanation, has been described with reference to specific embodiments. However, the illustrative discussions above are not intended to be exhaustive or to limit the claims to the precise forms disclosed. Many modifications and variations are possible in view of the above teachings. The embodiments were chosen and described in order to best explain principles of operation and practical applications, to thereby enable others skilled in the art to best utilize the invention and the various embodiments.

What is claimed is:

1. A light-emitting diode (LED) chip structure, comprising:
   a substrate;
   an isolation element, comprising
      an upper isolation part and a lower isolation part, wherein the lower isolation part is positioned in the substrate and the upper isolation part protrudes from a surface of the substrate;
   a reflective layer disposed on a sidewall of the upper isolation part; and
   a mesa including an LED component surrounded by the isolation element, wherein a bottom portion of the reflective layer does not contact the mesa;
   wherein an entire area of a top surface and a sidewall of the mesa, and a top surface and the sidewall of the upper isolation part are directly or indirectly covered by a seamless conductive layer.

2. The LED chip structure according to claim 1, wherein the reflective layer is disposed on the sidewall and the top surface of the upper isolation part, and a bottom of the reflective layer extends from the isolation element to the mesa.

3. The LED chip structure according to claim 1, wherein a dielectric layer is disposed at a bottom of the sidewall of the mesa, and the dielectric layer is covered by the bottom portion of the reflective layer.

4. The LED chip structure according to claim 1, wherein a height of the upper isolation part is higher than a height of the lower isolation part.

5. The LED chip structure according to claim 1, wherein a bottom width of the upper isolation part is equal to or wider than a top width of the lower isolation part.

6. The LED chip structure according to claim 5, wherein the bottom width of the upper isolation part is longer than the top width of the lower isolation part and shorter than twice the top width of the lower isolation part, two protrusions are formed at each bottom end of the upper isolation part, and a width of each of the two protrusions is less than half of the top width of the lower isolation part.

7. The LED chip structure according to claim 5, wherein, in a side view, a cross section of the upper isolation part is a trapezoid and a cross section of the lower isolation part is an inverted trapezoid, a bottom of the upper isolation part covering a top of the lower isolation part.

8. The LED chip structure according to claim 5, wherein the upper isolation part and the lower isolation part are axisymmetric and co-axial.

9. The LED chip structure according to claim 1, wherein a height of the upper isolation part is higher than a height of the mesa, relative to a surface of the substrate, and a tilt angle of the sidewall of the upper isolation part is greater than a tilt angle of the sidewall of the mesa, relative to an axis normal to the surface of the substrate.

10. The LED chip structure according to claim 9, wherein the tilt angle of the sidewall of the mesa is smaller than 45°, and the tilt angle of the sidewall of the upper isolation part is greater than 45°.

11. The LED chip structure according to claim 3, wherein the dielectric layer covers the top surface and the sidewall of the mesa, the top surface of the mesa including an area free of the dielectric layer.

12. The LED chip structure according to claim 3, wherein the dielectric layer is transparent to light emitted from the LED chip structure.

13. The LED chip structure according to claim 3, wherein the dielectric layer comprises one or more of silicon-containing dielectric layer, aluminum-containing dielectric layer or titanium-containing dielectric layer.

14. The LED chip structure according to claim 13, wherein the silicon-containing dielectric layer comprises an oxide or nitride of silicon, the aluminum-containing dielectric layer comprises an oxide of aluminum, and the titanium-containing dielectric layer comprises an oxide of titanium.

15. The LED chip structure according to claim 14, wherein the oxide of titanium is $Ti_3O_5$.

16. The LED chip structure according to claim 1, wherein the reflective layer includes a multi-layered structure.

17. The LED chip structure according to claim 16, wherein the multi-layered structure comprises a stack of one or more reflective material layers and one or more dielectric material layers.

18. The LED chip structure according to claim 1, wherein the reflective layer comprises one or more metallic conductive materials with a high reflectance above 80%.

19. The LED chip structure according to claim 18, wherein the one or more metallic conductive materials comprise one or more of aluminum, gold or silver.

20. The LED chip structure according to claim 1, wherein the seamless conductive layer is transparent to light emitted from the LED chip structure.

21. The LED chip structure according to claim 1, wherein the isolation element comprises photosensitive dielectric material.

22. The LED chip structure according to claim 21, wherein the photosensitive dielectric material is SU-8 or photosensitive polyimide (PSPI).

23. The LED chip structure according to claim 1, wherein the substrate comprises a semiconductor wafer and a bonding metal layer on top of the semiconductor wafer.

* * * * *